(12) United States Patent
Takao et al.

(10) Patent No.: US 7,955,673 B2
(45) Date of Patent: Jun. 7, 2011

(54) PVD CYLINDRICAL TARGET

(75) Inventors: Toshiaki Takao, Shimotsuga-gun (JP); Takahiro Okazaki, Shimotsuga-gun (JP); Hirofumi Fujii, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 329 days.

(21) Appl. No.: 11/755,318

(22) Filed: May 30, 2007

(65) Prior Publication Data
US 2008/0003385 A1 Jan. 3, 2008

(30) Foreign Application Priority Data

Jun. 29, 2006 (JP) ................. 2006-179874

(51) Int. Cl.
*B32B 1/08* (2006.01)
*B32B 27/00* (2006.01)
(52) U.S. Cl. ............ 428/35.7; 428/34.1; 428/34.2; 428/35.9; 428/36.9
(58) Field of Classification Search ............ 428/34.1, 428/34.2, 35.7, 35.9, 36.9
See application file for complete search history.

(56) References Cited

U.S. PATENT DOCUMENTS

| | | | |
|---|---|---|---|
| 5,354,446 A | 10/1994 | Kida et al. | 204/298 |
| 5,593,624 A * | 1/1997 | Lewis | 264/48 |

FOREIGN PATENT DOCUMENTS

| | | |
|---|---|---|
| EP | 1 752 556 A1 | 2/2007 |
| JP | 64-17862 | 1/1989 |
| JP | 5-230645 | 9/1993 |
| JP | 07-173622 | 7/1995 |
| JP | 7-173622 | 7/1995 |
| JP | 7-228967 | 8/1995 |
| JP | 8-109472 | 4/1996 |
| JP | 9-195039 | 7/1997 |
| JP | 2000-199055 | 7/2000 |

OTHER PUBLICATIONS

Office Action issued Nov. 24, 2010, in Japan Patent Application No. 2006-179874 (with English Language Translation).

* cited by examiner

*Primary Examiner* — Marc A Patterson
(74) *Attorney, Agent, or Firm* — Oblon, Spivak, McClelland, Maier & Neustadt, L.L.P.

(57) ABSTRACT

The present invention provides a PVD cylindrical target comprising an evaporation material covering the outer circumferential surface of a cylindrical substrate, the PVD cylindrical target includes a meshing part having at least either of a protruding shape and a recessed shape formed with rounded angular parts at the interface between the substrate and the evaporation material. According to such a structure, peeling or cracking of the evaporation material by a residual stress caused at the interface between the substrate and the evaporation material by a thermal expansion difference between the both can be suppressed, and sufficient adhesiveness between the both can also be ensured.

7 Claims, 6 Drawing Sheets

PVD CYLINDRICAL TARGET

BACKGROUND OF THE INVENTION

1. Field of the Invention

The present invention relates to a PVD cylindrical target used for a PVD process (Physical Vapor Deposition) such as sputtering or vacuum arc deposition.

2. Description of the Related Art

Conventionally known arts include, for example, a PVD cylindrical target having an evaporation material such as Cr bonded (sintered) to the outer circumferential surface of a cylindrical substrate consisting of Fe or stainless material by hot isostatic pressing (HIP) process. In this kind of PVD cylindrical targets, cracking or peeling is frequently caused between the evaporation material and the substrate since the substrate is constricted more largely than the evaporation material in a temperature-lowering process of the HIP treatment by a difference in thermal expansion coefficient (thermal expansion rate) between the substrate and the evaporation material. This phenomenon is hardly actualized in a PVD cylindrical target having a relatively small total length or diameter, but is conspicuous in a large PVD cylindrical target.

When such a PVD cylindrical target is used in incorporation into, for example, a PVD equipment, slippage resulted from the above-mentioned difference in thermal expansion coefficient occurs between the substrate and the evaporation material in the axial direction of the PVD cylindrical target in accordance with temperature rise during use, disabling the use thereof.

To solve this problem, for example, a PVD cylindrical target disclosed in Japanese Patent Application Laid-Open No. 7-173622 is adapted to suppress axial slippage between the both by forming a protruding part or recessed part on the outer circumferential surface of the substrate.

Further, PVD cylindrical targets disclosed in Japanese Patent Laid-Open No. 9-195039 and Japanese Patent Laid-Open No. 5-230645 are adapted to suppress peeling or cracking between the substrate and the evaporation material by interposing an intermediate layer for suppressing diffusions of the evaporation material and the substrate between the both.

However, when the PVD cylindrical targets of the above-mentioned Japanese Patent Laid-Open No. 9-195039 and Japanese Patent Laid-Open No. 5-230645 are formed using, as the evaporation material, a material consisting of two or more kinds of elements such as CrB, which has an extremely small thermal expansion coefficient, compared with Fe constituting the substrate or Ni or the like used as the intermediate layer, an extremely large stress is left within the PVD cylindrical target after HIP treatment or during PVD work due to the thermal expansion difference between the materials, causing the cracking or peeling of the evaporation material.

Further, since the material such as CrB is extremely brittle, the protruding part or recessed part having a sharp angular portion as described in Laid-Open No. 7-173622 is possible to easily cause cracking or peeling of the evaporation material by the concentration of stress to the angular portion.

SUMMARY OF THE INVENTION

The present invention provides a PVD cylindrical target, capable of suppressing peeling or cracking of the evaporation material by a residual stress generated at the interface between the substrate and the evaporation material due to a thermal expansion difference between the both, and ensuring sufficient adhesiveness between the both. To attain the above object, the present invention takes the following technical measure.

Namely, the present invention takes the following technical measure to solve the problem, the PVD cylindrical target according to the present invention comprises an evaporation material covering the outer circumferential surface of a cylindrical substrate, the PVD cylindrical target includes a meshing part consisting of at least either of a protruding shape and a recessed shape at the interface between the substrate and the evaporation material, and at least either of the protruding shape and the recessed shape is formed with a rounded angular portion. The definition "a rounded angular portion" above means that at least the portion between the apex (or bottom) of the protruding (or recessed) shape and the slant face should be rounded. Accordingly, the at least either of the protruding shape and recessed shape may partially include a flat plane.

According to this, since the angular part is formed of a curved surface, the concentration of residual stress to the angular portion can be eliminated. Therefore, the peeling or cracking of the evaporation material resulted from the stress concentration can be suppressed. Further, since the substrate and the evaporation material are laid in a mutually meshed state through the meshing part, the adhesiveness between the both can be ensured even if the thermal expansion coefficient is differed between the both.

The meshing part preferably includes both or either of a protruding streak and a recessed streak formed over the circumferential direction of the substrate.

According to this, the adhesiveness at the interface between the both can be ensured over the circumferential direction of the PVD cylindrical target.

The meshing part is preferably formed in a bellows shape in which the protruding streak and the recessed streak are alternately continuously disposed in the axial direction of the substrate.

According to this, machining for forming the protruding streak and the recessed streak on the outer circumferential surface of the substrate can be facilitated, resulting in a reduced manufacturing cost of the substrate.

The meshing part is preferably formed in a thread shape in which the recessed streak is disposed adjacently to the protruding streak.

According to this, even if cracking extending from the inner circumference of the evaporation material to the outer circumference thereof is caused in a part of the evaporation material, the cracking develops along the protruding streak or recessed streak, and annular connection of the cracking in the circumferential direction of the PVD cylindrical target can be thus prevented. Consequently, potential for division of the evaporation material into two pieces by cracking can be eliminated.

To satisfactorily ensure the effects as described above, preferably, the pitch of the recessed streak is set to 1 mm or more and 20 mm or less, the interval between the apex of the protruding streak and the bottom of the recessed streak is set to 0.5 mm or more and 5 mm or less, the inclination of a slant face connecting the protruding streak with the recessed streak is set to 80° or less to the axial center of the substrate, and the curvature radius at the apex of the protruding streak and the bottom of the recessed streak is set to 0.5 mm or more.

The meshing part preferably includes a plurality of protruding streaks on the outer circumferential surface of the substrate, with a flat part each between adjacent protruding streaks.

According to this, by forming a small number of protruding streaks, the adhesiveness of a necessary portion can be improved, and the working process can also be reduced.

The meshing part is preferably formed extending between one end and the other end of the substrate.

According to this, the residual stress can be dispersed to the whole body of the PVD cylindrical target extending between one end and the other end of the substrate, and the peeling or cracking of the evaporation material can be more effectively suppressed.

The adhesiveness between the both materials can be ensured over the whole length of the PVD cylindrical target.

Further, the meshing part is preferably formed in a dimpled shape including a plurality of recessed portions scattered over the outer circumferential surface of the substrate.

According to this, since the recessed portions are not continuous but dotted, the protruding portions are formed like dots on the inner circumferential surface of the evaporation material formed so as to cover the outer circumferential surface of the substrate. Therefore, even if cracking is caused in the evaporation material, development of the cracking is blocked by the protruding portions, and the cracking can be further effectively suppressed.

To satisfactorily ensure this effect, the plurality of recessed portions are preferably formed on the outer circumferential surface of the substrate at a pitch of 1 mm or more and 20 mm or less, with a diameter on the outer circumferential surface of 1 mm or more and 10 mm or less and a depth from the outer circumferential surface of 0.5 mm or more and 5 mm or less.

According to the present invention, peeling or cracking of the evaporation material by the residual stress caused at the interface between the substrate and the evaporation material by the thermal expansion difference between the both can be suppressed, and sufficient adhesiveness between the both can be ensured.

DESCRIPTION OF THE PREFERRED EMBODIMENTS

Preferred embodiments of the present invention will be described based on the drawings.

Figure 1:
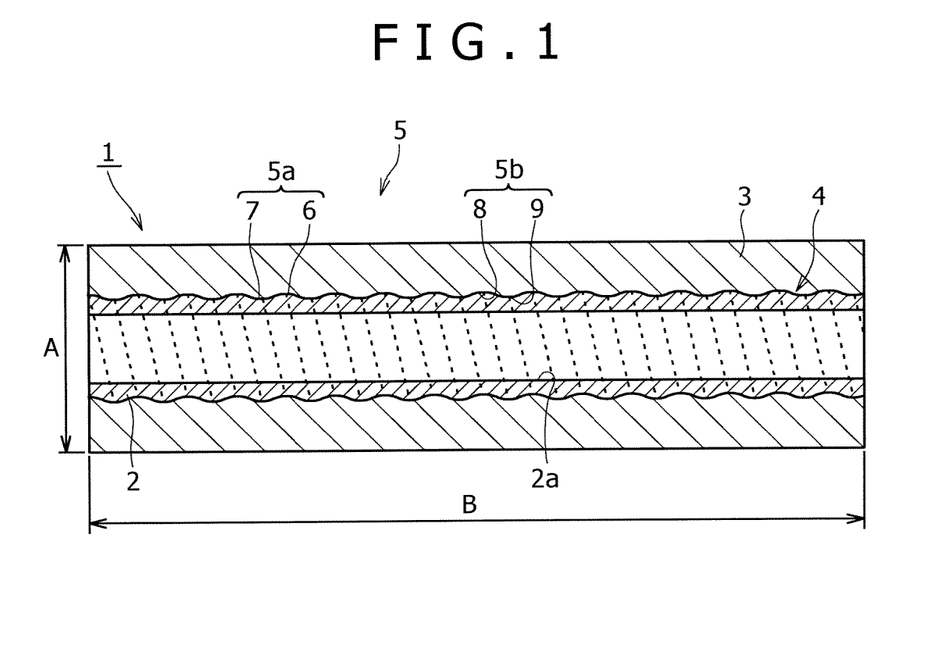
FIG. 1 is an axially cross-sectional view of a PVD cylindrical target according to a first embodiment of the present invention.

FIG. 1 shows a PVD cylindrical target 1 according to a first embodiment of the present invention, wherein the PVD cylindrical target 1 comprises a cylindrical substrate 2 and an evaporation material (target material) 3 covering the outer circumferential surface of the substrate 2. The substrate 2 is formed of a chamber having a circular section. A meshing part 5 of a corrugated shape with a rounded angular portion is formed at the interface 4 between the substrate 2 and the evaporation material 3.

The evaporation material 3 is formed of a film-forming material for forming a coat on a work by PVD process, and integrally bonded to the outer circumferential surface of the substrate 2 as a layer having a predetermined thickness by HIP treatment.

Although a stainless material (SUS) is used as the substrate 2, and CrB is used as the evaporation material 3 in present embodiment, Fe or a Fe-based material can be used also as the substrate 2, and CrAl, CrN, CrBSi, CrBTi, CrBV, TiB, TiSi, TiAlV, TiAlSi, N, TiN, $B_4C$, BN, AlN, $Al_2O_3$, C and the like can be used also as the evaporation material 3.

The meshing part 5 includes a male threaded part 5a formed on the outer circumferential surface of the substrate 2 and a female threaded part 5b formed on the inner circumferential surface of the evaporation material 3, extending between one end and the other end of the PVD cylindrical target 1. The male threaded part 5a is formed in a male thread shape in which a substrate-side protruding streak (protruding streak) 6 and a substrate-side recessed streak (recessed streak) 7 formed over the circumferential direction of the substrate with rounded angular portions are alternately continuously disposed in the axial direction of the substrate 2. The female threaded part 5b is formed in a female thread shape in which an evaporation material-side recessed streak 8 opposed to the substrate-side protruding streak 6 and an evaporation material-side protruding streak 9 filling the substrate-side recessed streak 7 are alternately continuously disposed in the axial direction of the evaporation material 3.

Figure 2:
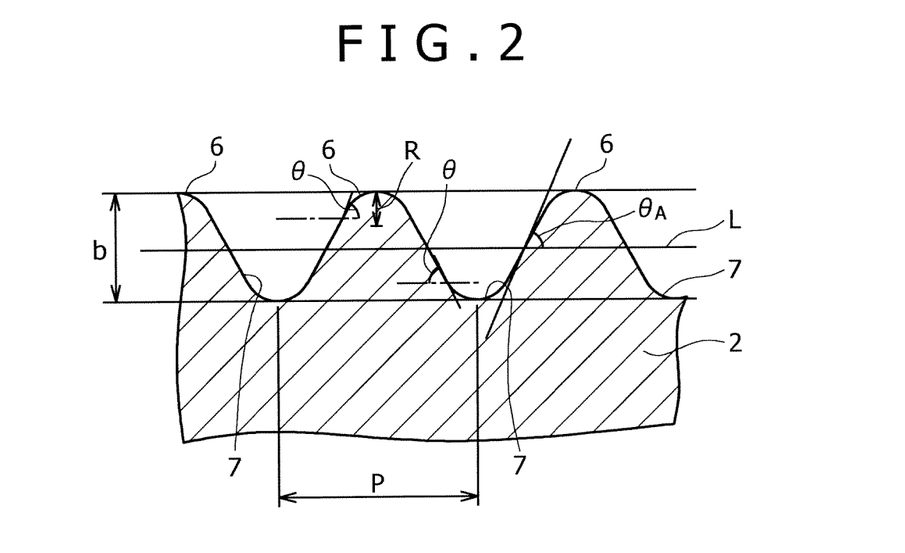
FIG. 2 is an enlarged axially cross-sectional view showing an essential part of a substrate in the first embodiment.

The PVD cylindrical target 1 of present embodiment has an outer shape dimension of diameter A=140 mm and length B=600 mm. As shown in FIG. 2, pitch P of the substrate-side recessed streak 7 is set to 5 mm, depth D that is the interval between the bottom of the substrate-side recessed streak 7 and the apex of the substrate-side protruding streak 6 is set to 1 mm, the inclination $\theta_A$ of a slant face connecting the substrate-side protruding streak 6 with the substrate-side recessed streak 7 to a straight line L parallel to the axis of the substrate 2 which passes through the center of a straight line connecting the apex of the substrate-side protruding streak 6 with the bottom of the substrate side recessed streak 7 adjacent thereto is set to 32°, and the curvature radius at the apexes of the substrate-side protruding streak 6 and the substrate-side recessed streak 7 is set to 1.3 mm.

The PVD cylindrical target 1 of present embodiment has the above-mentioned structure. The method for manufacturing the PVD cylindrical target 1 will then be described.

The substrate-side protruding streak 6 and the substrate-side recessed streak 7 which constitute the male threaded part 5a of the meshing part 5 are first formed in a thread shape on the outer circumferential surface of a substrate material consisting of a rod having a solid section.

The substrate material is put into a bottomed cylindrical capsule. At that time, desirably, the axial center of the capsule is perfectly or substantially matched with the axial center of the substrate material. The evaporation material 3 is filled in the space between the capsule and the substrate material, and after the capsule is evacuated and sealed, the evaporation material 3 is sintered and bonded to the substrate material by HIP treatment. Consequently, the evaporation material-side protruding streak 9 and the evaporation material-side recessed streak 8 are formed on the evaporation material 3 in conformation to the substrate-side protruding streak 6 and the substrate-side recessed streak 7 of the substrate material to constitute the female threaded part 5b, whereby the meshing part 5 is formed at the interface 4 between both the materials 2 and 3.

After the HIP treatment, a through-hole 2a for cooling water passage is machined in a central portion of the substrate material, whereby the substrate 2 is formed. Further, both the ends and the outer circumference thereof are finished into predetermined shapes, whereby the PVD cylindrical target 1 is completed.

In the formation of the meshing part 5 as described above, the dimensional relation between the substrate-side protruding streak 6 and the substrate-side recessed streak 7 constituting the male threaded part 5a is regulated as follows.

The pitch P of the substrate-side recessed streak 7 is set in the range of 1 mm to 20 mm. The pitch P is set more preferably in the range of 2 mm to 10 mm and most preferably in the range of 4 mm to 7 mm.

Figure 3:
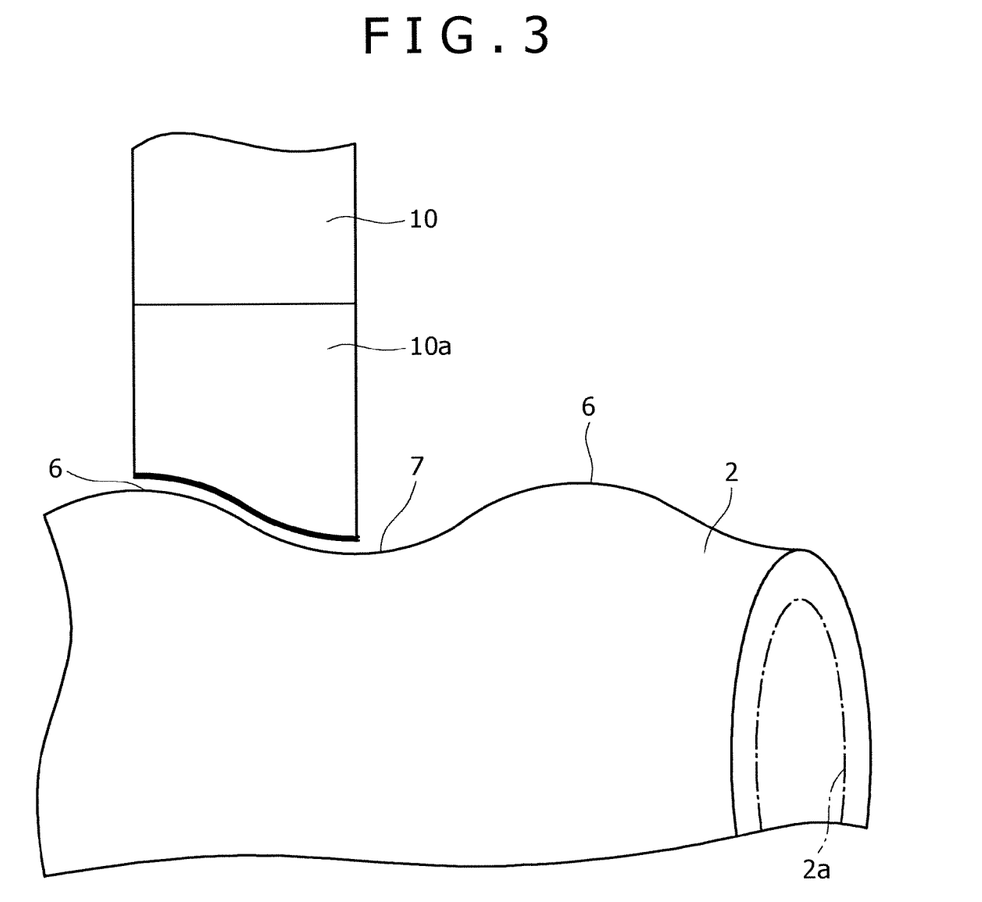
FIG. 3 is a perspective view showing the process of forming a protruding streak and a recessed streak on a substrate material.

As shown in FIG. 3, the substrate-side protruding streak 6 and the substrate-side recessed streak 7 are formed by pressing a tool 10 having a cutting edge 10a onto the outer circumferential surface of the substrate material which is rotated at high speed around the axis and automatically fed in the axial direction, and cutting the substrate material thereby. Therefore, if the pitch P is less than 1 mm, a sufficient adhesion effect cannot be obtained in the subsequent bonding of the evaporation material 3 although the working process is increased.

When the pitch P is larger than 20 mm, the contact area of the cutting edge 10a of the tool 10 with the substrate material is increased to increase the resistance to the rotation of the substrate material, resulting in a reduced processing rate.

Further, at the pitch P larger than 20 mm, the residual stress caused in the bonding of the evaporation material 3 by HIP treatment cannot be dispersed to the whole body of the PVD cylindrical target 1, and cracking of the evaporation material 3 may be caused by local action of the residual stress thereto in spite of the corrugated outer circumference of the substrate 2.

When the pitch P of the substrate-side recessed streak 7 is set to, for example, several cm to a PVD cylindrical target with a total length of several tens cm (60 cm in present embodiment), several to several tens substrate-side protruding streaks 6 and substrate-side recessed streaks 7 are arranged in the longitudinal direction of the PVD cylindrical target. It is known that the thermal expansion coefficient of the stainless material used as the substrate 2 is $17.3 \times 10^{-6}$/K, and the thermal expansion coefficient of CrB used as the evaporation material 3 is smaller than that of the stainless material by about one digit. When the PVD cylindrical target 1 is formed by combination of these materials, an internal stress generated at the interface 4 between the substrate 2 and the evaporation material 3 is increased by the thermal expansion different between the both. Further, CrB is an extremely brittle material.

Therefore, in the above-mentioned several to several tens substrate-side protruding streaks 6 and substrate-side recessed streaks 7, the stress received by each substrate-side protruding streak 6 (substrate-side recessed streak 7) is increased, increasing the probability of causing cracking of the evaporation material 3 from the vicinity of the substrate-side protruding streaks 6. Consequently, for dispersing the stress in a PVD cylindrical target having an axial length of several tens cm, at least several tens substrate-side protruding streaks 6 and substrate-side recessed streaks 7 must be arranged in the longitudinal direction of the PVD cylindrical target, and the stress can be hardly dispersed in a corrugated shape with the pitch P larger than 20 mm. Even if the effect of dispersing the stress can be obtained to a certain degree in a large corrugated shape with the pitch P larger than 20 mm, the ratio of the evaporation material-side protruding streaks 9 filling the substrate-side recessed streaks 7 shown in FIG. 1 is increased. Since evaporation process is terminated before evaporation of the evaporation material 3 reaches the evaporation material-side recessed streaks 8 in the PVD process, the increase in the number of evaporation material-side protruding streaks 9 unrealistically leads to waste of the evaporation material 3.

Consequently, the pitch P is set in the range of 1 mm to 20 mm for the purpose of facilitating the machining of the substrate material and effectively dispersing the residual stress caused at the interface 4 between the both.

When the interval between the apex of the substrate-side protruding streak 6 and the bottom of the substrate-side recessed streak 7 is taken as depth D, as shown in FIG. 2, the depth D is set in the range of 0.5 mm to 5 mm, more preferably in the range of 0.8 mm to 3 mm, and most preferably in the range of 1 mm to 2 mm.

When the depth D is less than 0.5 mm, a sufficient meshing effect (adhesion effect) between the substrate 2 and the evaporation material 3 cannot be obtained since the constriction degree of the substrate 2 in HIP treatment becomes larger than the depth D. When the diameter of the substrate 2 is set to 50 mm, for example, in manufacture of the PVD cylindrical target 1 using Cr (thermal expansion coefficient $\alpha = 6.5 \times 10^{-6}$/K) as the evaporation material 3 and Fe (thermal expansion coefficient $\alpha = 11.3 \times 10^{-6}$/K) as the substrate 2, the interval between the both at a temperature difference of 500° C. is $(11.3 - 6.5) \times 10^{-6} \times 500 \times 50 \div 2 = 0.06$ mm or about 60 μm.

Namely, if pressurization is released when the evaporation material 3 is cooled to at about 500° C. in cooling process (temperature-lowering process) after sintered through temperature-rising and pressure-rising process in the HIP treatment, a clearance of 60 μm is formed between the substrate 2 and the evaporation material 3 during cooling to ordinary temperature. The clearance disadvantageously causes axial slippage between the both 2 and 3 when the PVD cylindrical target 1 is used on a PVD equipment.

For surely preventing the slippage between the both 2 and 3 even in a state having such a clearance, only roughing of the outer circumferential surface of the substrate in depths of about several μm to several tens μm, for example, by blasting is insufficient, and a depth of at least 5 times the clearance, desirably, 10 times (several hundreds μm) is needed.

In present embodiment, where the stainless material further larger in thermal expansion coefficient than Fe is used as the substrate 2, and CrB further smaller in thermal expansion coefficient than Cr is used as the evaporation material 3, the depth D must be set larger since the clearance is extended in proportion to the difference in thermal expansion coefficient.

Figure 4:
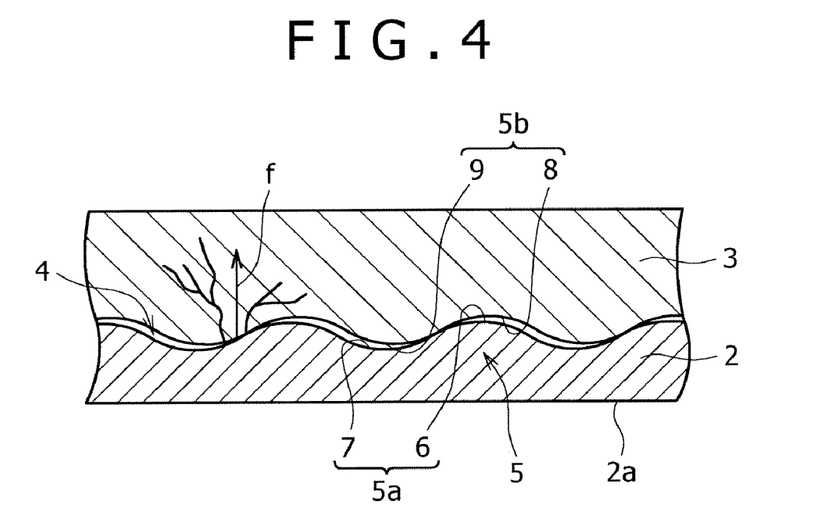
FIG. 4 is an enlarged axially cross-sectional view of an example of the interface in the first embodiment.

When the depth D is less than 0.5 mm, the evaporation material 3 receives a pressing force f (wedge effect) from the substrate 2 radially outwardly in the axial direction, as shown in FIG. 4, by rubbing of the substrate-side protruding streak 6 of the substrate 2 with the evaporation material-side protruding streak 9 of the evaporation material 3 in accordance with axial constriction of the substrate 2. Therefore, cracking in the evaporation material 3 can be easily caused.

A depth D larger than 5 mm leads to undesirable increase in working process or reduction in working rate.

Figure 5:
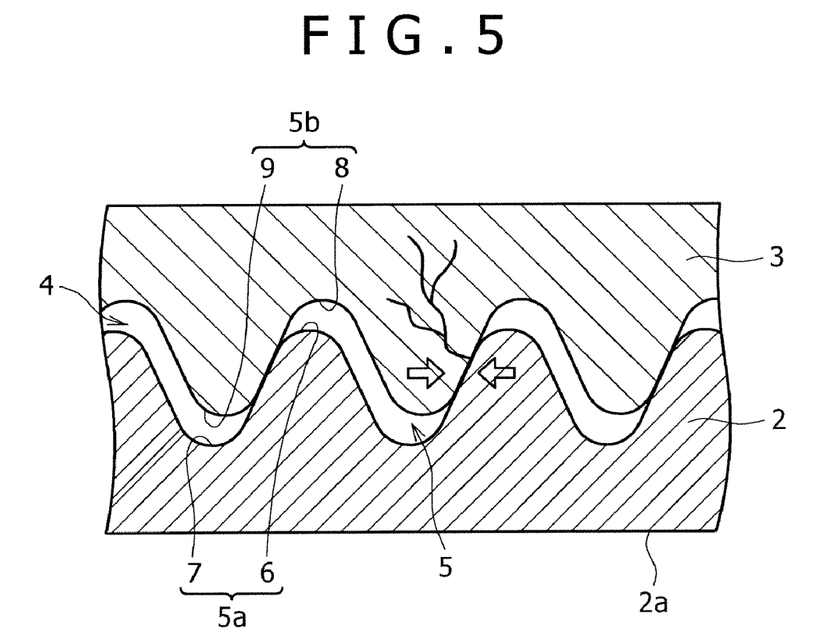
FIG. 5 is an enlarged axially cross-sectional view of another example of the interface therein.

As shown in FIG. 5, the substrate (substrate material) 2 is constricted more largely than the evaporation material 3 in the cooling process of HIP treatment. Therefore, if the depth D is set larger than 5 mm, the substrate-side protruding streak 6 strongly presses the evaporation material-side protruding streak 9 by the constriction of the substrate 2, whereby undesirable cracking is easily caused in the evaporation material-side protruding streak 9 which is extremely brittle.

Consequently, the depth D is set in the range of 0.5 mm to 5 mm for the purpose of preventing the slippage between the substrate 2 and the evaporation material 3, facilitating the machining, and suppressing the cracking by the constriction in HIP treatment.

The inclination θ at each position of a slant face connecting the substrate-side protruding streak 6 with the substrate-side recessed streak 7 to a straight line parallel to the axis of the substrate 2 shown by the chain line in FIG. 2 is set depending on the relation with the depth D. In view of setting the depth D as described above, the inclination θ is set in the range of $0°<\theta\leqq80°$, more preferably in the range of $0°<\theta\leqq60°$, and most preferably in the range of $0°<\theta\leqq45°$.

The same as for the inclination θ can be said for curvature radius R at the apexes of the substrate-side protruding streak 6 and the substrate-side recessed streak 7. In view of setting the depth D and the inclination θ as described above, the curvature radius R is set to 0.5 mm or more, more preferably to 1 mm or more, and most preferably to 2 mm or more.

In consideration that the ranges of the depth D, the inclination θ and the curvature radius R can be set in this manner, mutually adjacent substrate-side protruding streak 6 and substrate-side recessed streak 7 can be formed in a sine wave shape, and the apex(s) of both or either of the substrate-side protruding streak 6 and the substrate-side recessed streak 7 can be formed flatly.

According to present embodiment, since the substrate-side protruding streak 6 and substrate-side recessed streak 7 of the substrate 2 and the evaporation material-side protruding streak 9 and evaporation material-side recessed streak 8, which constitute the meshing part 5 provided at the interface 4 between the substrate 2 and the evaporation material 3, are formed with rounded angular portions, the concentration of stress to angular portions can be eliminated, and cracking of the evaporation material 3 cannot be easily caused at the interface 4. Since the substrate 2 and the evaporation material 3 are in a mutually meshed state through the meshing part 5, the adhesiveness between both the materials 2 and 3 can be ensured even if both the materials 2 and 3 are axially or radially expanded or constricted by a change of thermal state in the HIP treatment or PVD work, and axial slippage between both the materials 2 and 3 or the like can be consequently prevented.

Since the substrate-side protruding streak 6 and substrate-side recessed streak 7 of the substrate 2 are formed in a thread shape, even if cracking extending from the inner circumference of the evaporation material 3 to the outer circumference thereof is caused in a part of the evaporation material 3, annular connection of the cracking in the circumferential direction of the PVD cylindrical target 1 can be prevented because the development of the cracking is laid along the substrate-side protruding streak 6 or the substrate-side recessed streak 7. Therefore, potential for division of the evaporation material 3 to two pieces by cracking can be eliminated.

Figure 6:
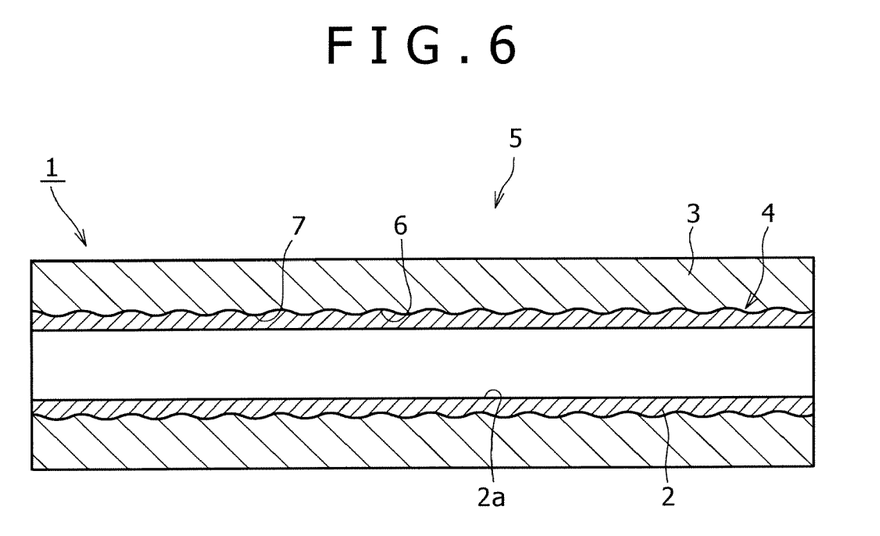
FIG. 6 is an axially cross-sectional view of a PVD cylindrical target according to a second embodiment of the present invention.
Figure 7:
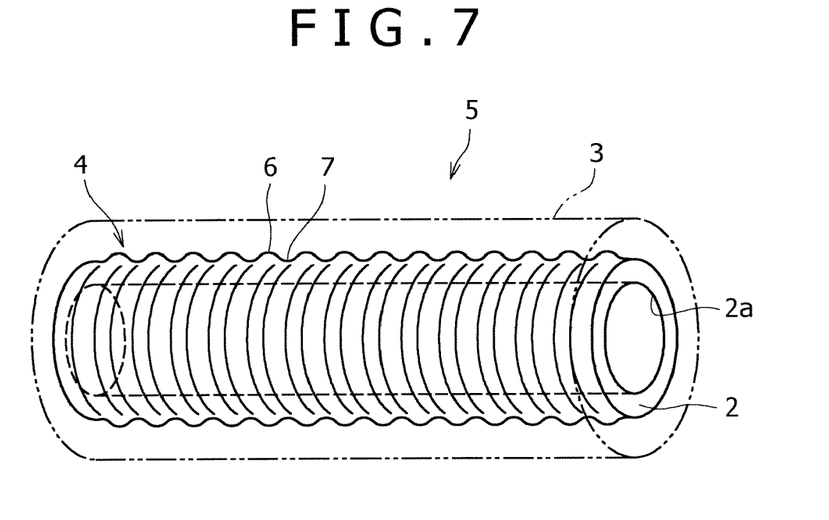
FIG. 7 is a perspective view of the PVD cylindrical target in the second embodiment.

FIGS. 6 and 7 show a second embodiment of the present invention. In the second embodiment, the meshing part 5 is formed in a bellows shape by alternately continuously forming the substrate-side protruding streak 6 and the substrate-side recessed streak 7 in the axial direction of the substrate 2. According to this, not only the adhesiveness of the interface 4 between the substrate 2 and the evaporation material 3 can be ensured over the circumferential direction of the PVD cylindrical target 1, but also the machining of the substrate 2 can be facilitated to reduce the cost of the substrate 2. Namely, the formation of the substrate-side protruding streak 6 and the substrate-side recessed streak 7 on the outer circumferential surface of the substrate 2 in a thread shape as in the first embodiment needs a process for putting an specialized tool (the tool 10 shown in FIG. 3) on the outer circumferential surface of the substrate material and engraving the substrate material while rotating the material around the axis in this state and automatically feeding it in the axial direction. However, this process requires replacement of a plurality of kinds of specialized tools according to the progress of the machining, which results in increase in the number of specialized tools or the working process, and this process is thus extremely difficult and troublesome.

Contrary to this, when the substrate-side protruding streak 6 and the substrate-side recessed streak 7 are formed in a bellows shape on the outer circumferential surface of the substrate 2 as in present embodiment, the streaks can be formed without requiring the automatic axial feed of the substrate material only by rotating the substrate material around the axis while placing the specialized tool on the outer circumferential surface thereof. According to present embodiment, therefore, the number of specialized tools or the working process can be reduced, compared with the first embodiment adapted to form the substrate-side protruding streak 6 and the substrate-side recessed streak 7 in the thread shape on the outer circumferential surface of the substrate 2, and the substrate 2 can be more easily formed than in the first embodiment.

When the substrate-side protruding streak 6 and the substrate-side recessed streak 7 are formed in a thread shape extending between one end and the other end of the substrate 2, sharp angular portions may be formed at the ends of the substrate 2, and the working process is increased by the necessity of a process for rounding the angular portions. On the other hand, no sharp angular portions are formed at the ends of the substrate 2 according to present embodiment, and the working process can be thus reduced.

Figure 8:
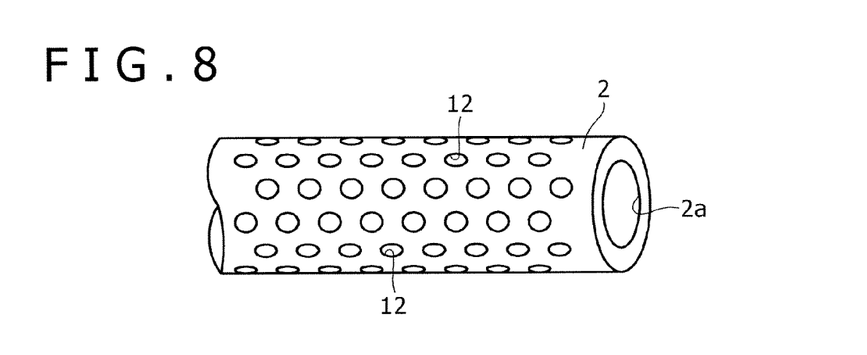
FIG. 8 a perspective view of the substrate of a PVD cylindrical target according to a third embodiment of the present invention.
Figure 9:
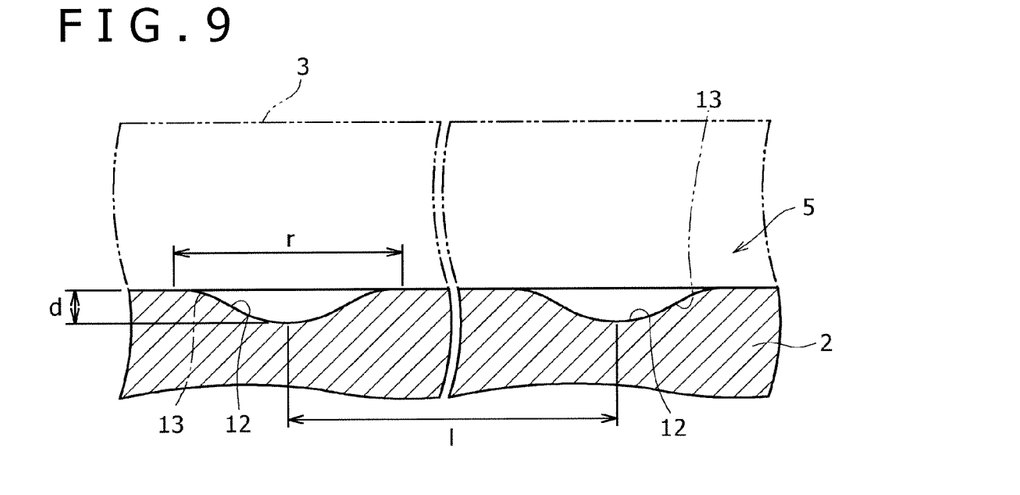
FIG. 9 is an enlarged axially cross-sectional view of the interface in the third embodiment.

FIGS. 8 and 9 show a third embodiment of the present invention. In the third embodiment, the meshing part 5 includes a plurality of recessed portions 12 scattered at equal intervals over the outer circumferential surface of the substrate 2 by dimpling of the substrate 2. Each recessed portion 12 is formed as a mortar-like dent, and the dimensional relation of the recessed portion 12 is set, as shown in FIG. 9, so that the pitch 1 of the recessed portion 12 is 1 mm to 20 mm, the diameter r on the outer circumferential surface of the substrate 2 is 1 mm to 10 mm, and the depth d from the outer circumferential surface is 0.5 mm to 5 mm, desirably 1 mm to 3 mm.

When the pitch 1 of the recessed portion 12 is less than 1 mm, dropping-out of the substrate 2 from the evaporation material 3 may be caused by a reduced adhesive force between the substrate 2 and the evaporation material 3, and when the pitch 1 is larger than 20 mm, shaking of the substrate 2 to the evaporation material 3 may be caused by a reduced adhesive force between the substrate 2 and the evaporation material 3. The present inventors know that such a problem is never caused when the pitch 1 is set to 1 mm to 20 mm.

When the diameter r of the recessed portion 12 is set smaller than 1 mm or larger than 10 mm, dropping-out of the substrate 2 from the evaporation material 3 may be caused by a reduced adhesive force between the substrate 2 and the evaporation material 3. The present inventors know that such a problem is never caused when the diameter r is set to 1 mm to 10 mm.

When the depth d of the recessed portion 12 is less than 0.5 mm, also, dropping-out of the substrate 2 from the evaporation material 3 may be caused by a reduced adhesive force between the substrate 2 and the evaporation material 3. When the depth d is larger than 5 mm, the working process for the substrate 2 is increased although the adhesiveness between the substrate 2 and the evaporation material 3 is increased, undesirably resulting in an increased cost. The present inventors know that such a problem is never caused when the depth d is set to 0.5 mm to 5 mm.

According to the third embodiment, the residual stress caused by the thermal expansion difference between the both 2 and 3 at the time of HIP treatment for bonding the evaporation material 3 to the outer circumference of the substrate 2 is dispersed to the whole body of the PVD cylindrical target 1.

Projections 13 are consequently formed in positions opposed to a plurality of recessed portions 12 of the substrate 2 on the inner circumferential surface of the evaporation material 3. The projections 13 are larger in strength than the other part because of its large thickness. Therefore, if cracking starting from a position opposed to any one recessed portion 12 of the substrate or between recessed portions 12 is caused in the evaporation material 3, or cracking is caused starting from any one projection 13 or between projections 13 of the evaporation material 3, the cracking is prevented from developing by encountering the projections 13 with high strength, whereby further development of the cracking is suppressed.

Figure 10:
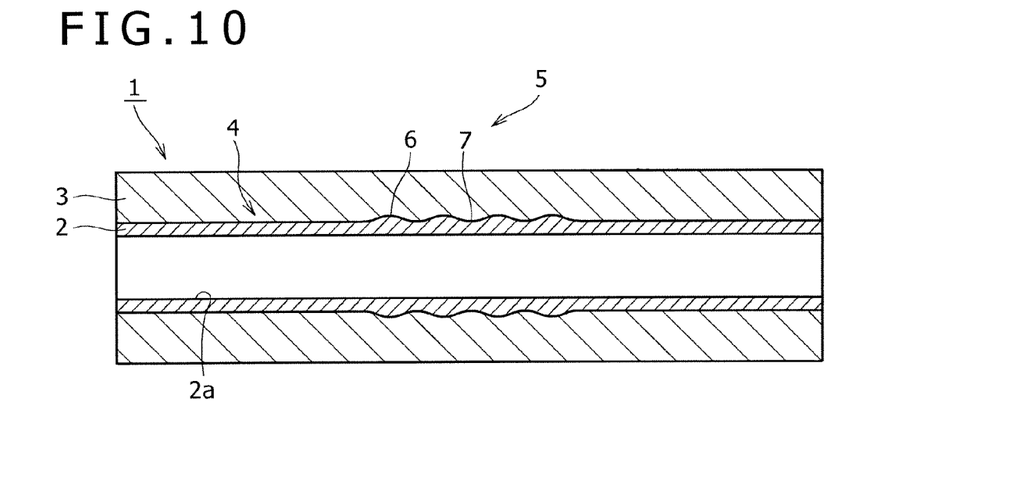
FIG. 10 is an axially cross-sectional view of a PVD cylindrical target according to another embodiment of the present invention.
Figure 11:
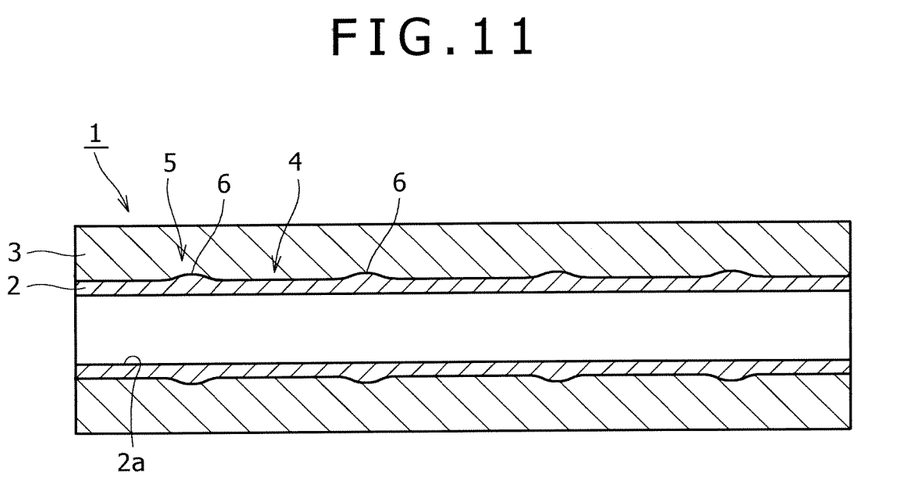
FIG. 11 is an axially cross-sectional view of a PVD cylindrical target according to the other embodiment of the present invention.

Although the preferred embodiments of the present invention were described above, the present invention is never limited by these embodiments. For example, the same effect as in the above embodiments can be obtained by providing the meshing part 5 only at a longitudinal center part of the substrate 2 as shown in FIG. 10, or by providing the substrate-side protruding streaks 6 at several positions on the outer circumferential surface of the substrate 2 as shown in FIG. 11, with a flat part each between adjacent substrate-side protruding streaks 6.

Figure 12:
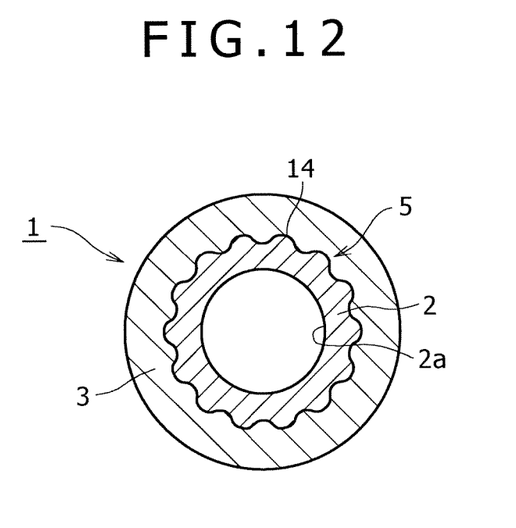
FIG. 12 is a radially cross-sectional view of a PVD cylindrical target according to further another embodiment of the present invention.

Further, protruding portions 14 are arranged at a predetermined pitch in the circumferential direction of the substrate 2 as shown in FIG. 12, whereby a structure in which the outer circumferential surface of the substrate 2 is not only axially but also circumferentially formed in corrugated shapes can be adapted.

A structure in which a plurality of recessed portions 12 are arranged at unequal intervals on the outer circumferential surface of the substrate 2 can also be adapted, and the same effect as in present embodiment can be obtained if protruding portions are arranged instead of the recessed portions 12.

Although the invention has been described with reference to the preferred embodiments in the attached figures, it is noted that equivalents may be employed and substitutions made herein without departing from the scope of the invention as recited in the claims.

The diameter of a PVD cylindrical target according to the present invention is preferably 30 mm to 200 mm.

We claim:

1. A PVD cylindrical target, comprising:
a cylindrical substrate; and
an evaporation material covering the outer circumferential surface of said substrate, wherein said evaporation material is more brittle than Cr,
wherein the PVD cylindrical target includes a meshing part consisting of at least either of a protruding shape and a recessed shape at the interface between said substrate and said evaporation material, and at least either of the protruding shape and the recessed shape is formed with a rounded angular part having a curvature radius of 0.5 mm or more,
wherein said protruding shape includes a protruding streak, and said recessed shape includes a recessed streak, formed over the circumferential direction of the substrate,
wherein said meshing part is formed in a bellows shape in which the protruding streak and the recessed streak are alternately continuously disposed in the axial direction of the substrate, and
wherein a pitch of said recessed streak is set to 1 mm or more and 20 mm or less, an interval between the apex of the protruding streak and the bottom of the recessed streak is set to 0.5 mm or more and 5 mm or less, an inclination of a slant face connecting the protruding streak with the recessed streak is set to 80° or less to an axial center of said substrate.

2. A PVD cylindrical target comprising:
a cylindrical substrate; and
an evaporation material covering the outer circumferential surface of said substrate, wherein said evaporation material is more brittle than Cr,
wherein the PVD cylindrical target includes a meshing part consisting of at least either of a protruding shape and a recessed shape formed over the circumferential direction of the substrate at the interface between said substrate and said evaporation material, and at least either of the protruding shape and the recessed shape is formed with a rounded angular part having a curvature radius of 0.5 mm or more,
wherein said protruding shape includes a protruding streak, and said recessed shape includes a recessed streak, formed over the circumferential direction of the substrate,
wherein said meshing part is formed in a thread shape in which the recessed streak is disposed adjacently to the protruding streak, and
wherein a pitch of said recessed streak is set to 1 mm or more and 20 mm or less, an interval between the apex of the protruding streak and the bottom of the recessed streak is set to 0.5 mm or more and 5 mm or less, an inclination of a slant face connecting the protruding streak with the recessed streak is set to 80° or less to an axial center of said substrate.

3. The PVD cylindrical target according to claim 1, wherein said meshing part includes a plurality of protruding streaks on the outer circumferential surface of said substrate with a flat part each between adjacent protruding streaks.

4. The PVD cylindrical target according to claim 1, wherein said meshing part is formed extending between one end and the other end of said substrate.

5. A PVD cylindrical target comprising:
a cylindrical substrate; and
an evaporation material covering the outer circumferential surface of said substrate, wherein said evaporation material is more brittle than Cr,
wherein the PVD cylindrical target includes a meshing part consisting of at least either of a protruding shape and a recessed shape at the interface between said substrate and said evaporation material, and at least either of the protruding shape and the recessed shape is formed with a rounded angular part having a curvature radius of 0.5 mm or more,
wherein said protruding shape or recessed shape comprises a dimpled shape including a plurality of recessed portions scattered over the outer circumferential surface of said substrate, and
wherein said plurality of recessed portions are formed on the outer circumferential surface of the substrate at a pitch of 1 mm or more and 20 mm or less with a diameter on the circumferential surface of 1 mm or more and 10 mm or less and a depth from the outer circumferential surface of 0.5 mm or more and 5 mm or less.

6. The PVD cylindrical target according to claim 1, wherein said evaporation material is at least as brittle as one of CrB, CrAl, CrN, CrBSi, CrBTi, CrBV, TiB, TiSi, TiAlV, TiAlSi, N, TiN, $B_4C$, BN, AlN, $Al_2O_3$ and C.

7. The PVD cylindrical target according to claim 1, wherein said evaporation material is CrB.

* * * * *